US009461218B2

(12) United States Patent
Illek et al.

(10) Patent No.: US 9,461,218 B2
(45) Date of Patent: Oct. 4, 2016

(54) SURFACE LIGHT SOURCE

(71) Applicant: OSRAM Opto Semiconductors GmbH, Regensburg (DE)

(72) Inventors: Stefan Illek, Donaustauf (DE);
Matthias Sabathil, Regensburg (DE);
Alexander Linkov, Regensburg (DE);
Thomas Bleicher, Regensburg (DE);
Norwin von Malm, Nittendorf (DE);
Wolfgang Mönch, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/385,116

(22) PCT Filed: Feb. 20, 2013

(86) PCT No.: PCT/EP2013/053356
§ 371 (c)(1),
(2) Date: Sep. 12, 2014

(87) PCT Pub. No.: WO2013/135470
PCT Pub. Date: Sep. 19, 2013

(65) Prior Publication Data
US 2015/0097198 A1    Apr. 9, 2015

(30) Foreign Application Priority Data

Mar. 13, 2012    (DE) .................. 10 2012 102 119

(51) Int. Cl.
*H01L 33/58* (2010.01)
*G02F 1/1335* (2006.01)
(Continued)

(52) U.S. Cl.
CPC ......... *H01L 33/58* (2013.01); *G02F 1/133603* (2013.01); *G02F 1/133606* (2013.01);
(Continued)

(58) Field of Classification Search
CPC ..... H01L 33/48; H01L 33/483; H01L 33/50; H01L 33/501; H01L 33/502; H01L 33/505; H01L 33/507; H01L 33/54; H01L 33/58; H01L 33/60
See application file for complete search history.

(56) References Cited

U.S. PATENT DOCUMENTS 8,382,337 B2 * 2/2013 Ing .................. B29D 11/00798
313/361.1
8,672,500 B2    3/2014 Muschaweck
(Continued)

FOREIGN PATENT DOCUMENTS

DE    102010028246 A1    10/2011
JP    2009170205 A    7/2009
(Continued)

OTHER PUBLICATIONS

"Conical De-Glaring Prism CDPS," Jungbecker Enlightening Solutions, Optics Datasheet, 2010, 1 page.
(Continued)

*Primary Examiner* — Eduardo A Rodela
(74) *Attorney, Agent, or Firm* — Slater Matsil, LLP (57) ABSTRACT

In at least one embodiment, a surface light source includes one or a more optoelectronic semiconductor chips having a radiation main side for generating a primary radiation. A scattering body is disposed downstream of the radiation main side along a main emission direction of the semiconductor chips. The scatting body is designed for scattering the primary radiation. A main emission direction of the scattering body is oriented obliquely with respect to the main emission direction of the semiconductor chip.

13 Claims, 7 Drawing Sheets

(51) Int. Cl.

| | |
|---|---|
| *H01L 33/44* | (2010.01) |
| *H01L 33/54* | (2010.01) |
| *H01L 25/075* | (2006.01) |
| *H01L 33/50* | (2010.01) |
| *H01L 33/60* | (2010.01) |
| *H01L 33/64* | (2010.01) |
| *F21Y 101/02* | (2006.01) |
| *F21Y 105/00* | (2016.01) |
| *F21V 8/00* | (2006.01) |

(52) U.S. Cl.
CPC .......... *H01L25/0753* (2013.01); *H01L 33/44* (2013.01); *H01L 33/507* (2013.01); *H01L 33/54* (2013.01); *H01L 33/60* (2013.01); *H01L 33/644* (2013.01); *F21Y 2101/02* (2013.01); *F21Y 2105/00* (2013.01); *G02B 6/0015* (2013.01); *G02B 6/0018* (2013.01); *G02B 6/0025* (2013.01); *G02F 1/133605* (2013.01); *G02F 1/133611* (2013.01); *G02F 1/133615* (2013.01); *G02F 2001/133607* (2013.01); *H01L 2924/0002* (2013.01); *H01L 2933/0091* (2013.01)

(56) References Cited

U.S. PATENT DOCUMENTS

| | | | |
|---|---|---|---|
| 2004/0218390 A1 | 11/2004 | Holman et al. | |
| 2006/0175625 A1* | 8/2006 | Yokotani | G02B 5/0231 257/95 |
| 2006/0181866 A1 | 8/2006 | Jung et al. | |
| 2007/0145397 A1* | 6/2007 | DenBaars | H01L 33/20 257/98 |
| 2008/0055931 A1 | 3/2008 | Verstraete et al. | |
| 2008/0101086 A1 | 5/2008 | Lee | |
| 2009/0128735 A1 | 5/2009 | Larson et al. | |
| 2009/0207586 A1 | 8/2009 | Arai et al. | |
| 2010/0271566 A1 | 10/2010 | Liao | |
| 2011/0006334 A1* | 1/2011 | Ishii | C09K 11/584 257/98 |
| 2011/0085110 A1 | 4/2011 | Lin et al. | |
| 2011/0254042 A1* | 10/2011 | Shaikevitch | H01L 33/54 257/98 |
| 2013/0039617 A1 | 2/2013 | Illek et al. | |
| 2015/0155439 A1* | 6/2015 | Cich | H01L 33/32 362/294 |

FOREIGN PATENT DOCUMENTS

| | | |
|---|---|---|
| JP | 2009175702 A | 8/2009 |
| JP | 2009192915 A | 8/2009 |
| JP | 2010529592 A | 8/2010 |
| JP | 2011249348 A | 12/2011 |
| WO | 0140702 A1 | 6/2001 |
| WO | 2007146860 A1 | 12/2007 |
| WO | 2008000244 A2 | 1/2008 |
| WO | 2008083188 A2 | 7/2008 |
| WO | 2008144136 A1 | 11/2008 |

OTHER PUBLICATIONS

"Circular Polarization," Harvard Natural Sciences Lecture Demonstrations, Retrieved on Apr. 24, 2014, 1 page.
"Conical De-Glaring Prism CDP," Jungbecker Enlightening Solutions, Optics Datasheet, 2010, 1 page.
Hanzawa, F., "Lens Films and Reflective Polarization Films," LCD Backlights, Chapter 21, Apr. 16, 2009, pp. 257-267.
"Linear De-Glaring Prism LDP," Jungbecker Enlightening Solutions, Optics Datasheet, 2010, 1 page.
"Plexiglas Endlighten: A new dimension of light," Evonik Industries, Apr. 11, 2010, 3 pages.
"Vikuiti—Rear Projection Display Screen," Vikuiti Projection Display Components, 3M Optical Systems Division, Jul. 2008, 8 pages.

* cited by examiner

SURFACE LIGHT SOURCE

This patent application is a national phase filing under section 371 of PCT/EP2013/053356, filed Feb. 20, 2013, which claims the priority of German patent application 10 2012 102 119.8, filed Mar. 13, 2012, each of which is incorporated herein by reference in its entirety.

TECHNICAL FIELD

A surface light source is specified.

SUMMARY OF THE INVENTION

Embodiments of the invention specify a surface light source that has a high efficiency in conjunction with comparatively small geometrical dimensions.

In accordance with at least one embodiment, the surface light source comprises one or a plurality of optoelectronic semiconductor chips. The semiconductor chips can be light-emitting diodes, LEDs for short. The semiconductor chips are designed for generating a primary radiation. The semiconductor chips have a radiation main side. The radiation main side is preferably oriented perpendicularly to a growth direction of an epitaxially produced semiconductor layer sequence of the semiconductor chips. If the surface light source comprises a plurality of semiconductor chips, then all of the semiconductor chips can be structurally identical and designed for generating radiation having the same wavelength. It is likewise possible for semiconductor chips configured differently from one another, for example, for generating radiation having different wavelengths, to be present.

In this case, a surface light source is a light source having an extensive luminous surface. In contrast thereto, point light sources have only a very small luminous surface. Frequent applications of surface light sources are in general lighting, for example, in recessed ceiling luminaires, and in the backlighting of liquid crystal displays.

In accordance with at least one embodiment, the surface light source comprises one or a plurality of scattering bodies. The at least one scattering body is designed for scattering the primary radiation. Along a main emission direction of the at least one semiconductor chip, the scattering body is disposed downstream of the radiation main side. In other words, the scattering body is situated above the radiation main side of the semiconductor chip. It is possible for no further, optically active components such as lenses, filters and/or conversion means for wavelength conversion to be situated between the radiation main side and the scattering body. Preferably, the scattering body completely covers the semiconductor chip, as seen in plan view. The scattering body can terminate flush with the semiconductor chip, as seen in plan view, or project laterally beyond the semiconductor chip.

In accordance with at least one embodiment, the scattering body has one or a plurality of main emission directions. The main emission direction is that direction in which the scattering body emits a maximum radiation power per solid angle. In particular, each main side of the scattering body is assigned a main emission direction. Preferably, the scattering body has exactly two main emission directions and exactly two main emission sides. If a plurality of main emission directions are present, then they can be formed by local maxima of the angle-dependent radiation intensity.

In accordance with at least one embodiment, the main emission direction of the scattering body or at least one of the main emission directions or all of the main emission directions is or are oriented obliquely with respect to the main emission direction of the semiconductor chip. By way of example, an angle between the former main emission direction and the latter main emission direction is at least 45° or at least 60° or at least 70° or at least 75°. Alternatively or additionally, said angle is at most 92° or at most 90° or at most 85° or at most 80°.

According to at least one embodiment, the surface light source comprises one or a plurality of optoelectronic semiconductor chips having a radiation main side for generating a primary radiation. A scattering body of the surface light source is disposed downstream of the radiation main side along a main emission direction of the semiconductor chips. The scattering body is designed for scattering the primary radiation. A main emission direction of the scattering body is oriented obliquely with respect to the main emission direction of the semiconductor chip.

In the case of such a surface light source, the scattering body deflects the main emission direction of the semiconductor chip, said main emission direction being oriented in particular perpendicularly to the radiation main side, in a main emission direction different therefrom. The scattering body therefore has a different emission characteristic from the semiconductor chip. By virtue of such a scattering body having a high optical efficiency, in particular with the use of a plurality of semiconductor chips having different emission wavelengths, a compact surface light source which emits radiation uniformly can be realized.

Such a surface light source also makes it possible to realize a comparatively small structural height and a high efficiency and also a sufficient color mixing in order to illuminate a working plane homogeneously. It is likewise possible to realize a high-efficiency surface light source whose light has a preferred polarization. With such a light source, it is possible to increase a system efficiency in the application as backlighting of liquid crystal displays. The term structural height here is taken to mean a dimension in a direction perpendicular to the extensive, luminous surface.

In accordance with at least one embodiment, the surface light source, as seen in plan view, has an average lateral dimension of at least 50 mm or of at least 100 mm or of at least 150 mm. The term surface light source can therefore mean that an emission side of the surface light source has an area of at least 0.01 m². Preferably, the surface light source emits homogeneously at the light exit side. Homogeneously can mean that a local radiation power deviates by at most 40% from an average value of the radiation power, averaged over the entire emission side. A color locus of a locally emitted radiation deviates from a color locus averaged over the emission side preferably by at most 0.02 unit or by at most 0.01 unit in the CIE standard chromaticity diagram.

In accordance with at least one embodiment of the surface light source, the scattering body has the shape of a body of revolution. By way of example, the scattering body is then shaped as a cylinder or as a cone or as a truncated cone.

In accordance with at least one embodiment of the surface light source, the scattering body has a polyhedral form. The scattering body is then shaped, for example, as a prism or as a pyramid or as a truncated pyramid.

In accordance with at least one embodiment, the scattering body has a cross-sectional area having a triangular basic shape. In this case, basic shape means that an outer contour of the scattering body, as seen in cross section, has the shape of a triangle. It is possible that comparatively small cutouts or indentations at a side, in particular at an underside of the scattering body facing the semiconductor chip, are not taken into account when determining the basic shape. The cross-sectional area is determined in particular in a sectional plane parallel to the main emission direction of the semiconductor chip and preferably also perpendicular to a main extension direction, for instance a longitudinal axis, of the scattering body. As an alternative to a triangular basic shape, it is also possible for the scattering body to have a trapezoidal basic shape.

In accordance with at least one embodiment, the scattering body has a cross-sectional area having a round shape. For example, the scattering body in cross section is a triangle, a rectangle or a trapezoid having rounded corners. Alternatively, the scattering body, as seen in cross section, can be of oval shape or have the shape of a semicircle or a semi ellipse.

In accordance with at least one embodiment, a width of the scattering body decreases along the main emission direction. In other words, the scattering body then becomes narrower in a direction perpendicular to the radiation main side and away from the radiation main side. The decrease in the width of the scattering body along the main emission direction preferably takes place monotonically or strictly monotonically.

In accordance with at least one embodiment, the scattering body has, along the main emission direction and/or along a direction perpendicular to the radiation main side, a height which is greater than a maximum width of the cross-sectional area of the scattering body having the triangular basic shape. In other words, the scattering body is then higher than its width, as seen in cross section in particular perpendicular to a main extension direction of the scattering body and perpendicular to the radiation main side of the semiconductor chip.

In accordance with at least one embodiment, the scattering body comprises a radiation-transmissive matrix material. The matrix material can be PMMA, a glass, a silicone, an epoxy and/or a silicone-epoxy hybrid material. Thermoplastics such as polycarbonate can also be used as matrix material for the scattering body. Scattering particles are embedded into the matrix material. The scattering particles preferably have a different refractive index than the matrix material. The scattering particles can be titanium dioxide particles or aluminum oxide particles. As an alternative or in addition to the scattering particles, particles of the conversion means can be embedded in the matrix material. It is possible for the scattering particles to be distributed in the scattering body homogeneously or deliberately inhomogeneously, for instance with a higher concentration near the semiconductor chips.

In accordance with at least one embodiment of the surface light source, the scattering body extends continuously and integrally over a plurality of the semiconductor chips. In other words, in that case a plurality of the semiconductor chips, which can be designed structurally identically or for emitting radiation having different wavelengths, are situated below the scattering body and are jointly covered by the scattering body.

In accordance with at least one embodiment, the semiconductor chips which are situated below the scattering body are combined to form a group with multicolored emission, in particular an RGB group. In other words, in that case at least one semiconductor chip which emits red light, at least one semiconductor chip which emits green light and/or at least one semiconductor chip which emits blue light are/is situated below the scattering body. The semiconductor chips are preferably arranged so as to be closely adjacent. This can mean that an average distance between adjacent semiconductor chips is at most 50% or 25% or 10% of the height of the scattering body.

In accordance with at least one embodiment, the scattering body is shaped rotationally symmetrically. For example, a lateral surface of the scattering body has the shape of a cone, of a truncated cone or of a truncated ellipsoid of revolution.

In accordance with at least one embodiment, at least some of the semiconductor chips which are arranged below a common scattering body are spaced far apart from one another. This can mean that a distance between these semiconductor chips is at least 100% or 200% or 300% of the height of the scattering body.

In accordance with at least one embodiment, the scattering body, relative to a height profile across the semiconductor chips, is free of local minima. The scattering body in this case has, in particular, no height modulation correlating with the semiconductor chips. In particular, the scattering body extends across all semiconductor chips with a constant height. Alternatively or additionally, the term constant height can mean that the height of the scattering body remains the same with a tolerance of at most 200% or 100% of a thickness of the semiconductor chips.

In accordance with at least one embodiment, the scattering body, relative to a height profile across the semiconductor chips, has one or a plurality of local minima. The scattering body can then have, in particular, a height modulation correlating with the semiconductor chips.

In accordance with at least one embodiment, the semiconductor chips over which the scattering body extends are arranged along at least one or exactly one straight line. A main extension direction of the scattering body is preferably oriented parallel to this straight line of arrangement of the semiconductor chips and can be situated, as seen in plan view, above this line of arrangement of the semiconductor chips.

In accordance with at least one embodiment, the main emission direction or the main emission directions of the scattering body, as seen in a plan view of the surface light source, is or are oriented perpendicularly to the line of arrangement of the semiconductor chips, preferably with a tolerance of at most 15° or of at most 10° or of at most 5°.

In accordance with at least one embodiment, the surface light source comprises a plurality of the scattering bodies. The scattering bodies are preferably arranged in a manner spaced apart from one another on a common carrier. The main emission direction of the semiconductor chips is preferably oriented perpendicular to a main side of the carrier.

In accordance with at least one embodiment, the scattering bodies or at least some of the scattering bodies are arranged parallel to one another. In particular, all of the scattering bodies can be oriented parallel to one another. The main emission directions of the scattering bodies or of at least some of the scattering bodies can also be oriented parallel to one another.

In accordance with at least one embodiment, at least some of the scattering bodies or all of the scattering bodies are arranged transversely with respect to one another or in a cruciform fashion. Arranged transversely with respect to one another means, in particular, that an angle between the scattering bodies and the main extension directions of the scattering bodies is between 30° and 90° inclusive, in particular approximately 90°. Cruciform can mean that the scattering bodies penetrate and partly overlap one another in a manner similar to a cross-ribbed vault. It is possible that in particular such scattering bodies are arranged transversely with respect to one another which are situated at an edge or at corners of the surface light source and/or of an arrangement grid of the scattering bodies.

In accordance with at least one embodiment, the scattering body is net-shaped, as seen in plan view. The semiconductor chips are then preferably arranged in a regular lattice and the scattering body can cover all semiconductor chips or at least some of the semiconductor chips.

In accordance with at least one embodiment, the scattering body is fitted directly on the radiation main side. Directly can mean that only a connecting means such as an adhesive is situated between the scattering body and the radiation main side. It is likewise possible for the scattering body to touch the radiation main side.

In accordance with at least one embodiment, side surfaces of the semiconductor chip are free of the scattering body. In a direction perpendicular to the side surfaces of the semiconductor chip and thus in particular in a direction parallel to the radiation main side, the semiconductor chip is then not covered by the scattering body. By way of example, the side surfaces of the semiconductor chip are surrounded and/or covered by a reflective potting or an adhesive for fixing the scattering body. In perpendicular projection onto the side surfaces, in that case preferably no scattering particles are situated above the side surfaces.

In accordance with at least one embodiment, the side surfaces of the semiconductor chip are partly or completely covered by the scattering body. The side surfaces can touch the scattering body.

In accordance with at least one embodiment, a quotient of a light emission area of the surface light source and the area of the radiation main side of the semiconductor chip is at least 100 or at least 250 or at least 1000 or at least 2500.

In accordance with at least one embodiment, the surface light source comprises one or a plurality of reflectors. The reflectors are designed to deflect the primary radiation scattered by the scattering body in a direction toward the emission side of the surface light source.

In accordance with at least one embodiment, the reflector, as seen in cross section, has the shape of a symmetrical or asymmetrical quadrilateral. It is possible for the reflector, as seen in plan view, to be fashioned as round, circular, oval, rectangular or rectangular with rounded corners.

In accordance with at least one embodiment, the reflector has a trapezoidal basic shape, as seen in a cross section in particular perpendicular to the radiation main side of the semiconductor chip. It is likewise possible for the reflector to have a triangular basic shape in cross section. The reflector is then shaped, for example, like the lateral surface of a pyramid, of a truncated pyramid, of a cone or of a truncated cone. The basic shape can have a mirror symmetry. In a departure therefrom, it is also possible for the reflector not to have side surfaces running along a straight line, but rather side surfaces curved in a paraboloidal fashion, for example.

In accordance with at least one embodiment, the reflector has an average lateral extent which exceeds an average edge length of the radiation main side of the semiconductor chip by at least a factor of 10 or at least a factor of 50 or at least a factor of 100. In other words, the reflector, as seen in plan view, is then significantly larger than the semiconductor chip.

In accordance with at least one embodiment, the surface light source comprises one or a plurality of heat sinks. The heat sink or at least one of the heat sinks comprises a heat sink top side. The at least one semiconductor chip is fitted to the heat sink top side. It is possible for the heat sink to have structurings at the heat sink top side and/or at a heat sink underside facing away from the heat sink top side. Cooling ribs can be formed by such structurings.

In accordance with at least one embodiment, the heat sink is designed for reflecting the primary radiation. It is possible for the heat sink top side to be oriented parallel to the radiation main side of the semiconductor chip or for the heat sink top side to run obliquely with respect thereto. The heat sink top side can be planar or run in a triangular shape or in a trapezoidal shape, as seen in cross section.

In accordance with at least one embodiment, the heat sink top side has an average lateral extent which exceeds the average edge length of the radiation main side of the semiconductor chip by at least a factor of 10 or at least a factor of 50 or at least a factor of 100.

In accordance with at least one embodiment, the light source comprises one or a plurality of radiation-transmissive light distributors. The at least one light distributor is shaped as a solid body. The light distributor can be an optical waveguide.

In accordance with at least one embodiment, the light distributor and/or the reflector are/is shaped rotationally symmetrically. In this case, an axis of symmetry is preferably oriented parallel to the main emission direction of the at least one semiconductor chip. The reflector and/or the light distributor are/is then embodied in a truncated cone shaped fashion, for example.

In accordance with at least one embodiment, the scattering body is completely or predominantly or at least in part fitted in a cutout of the light distributor. It is possible for the cutout in the light distributor, as seen in particular in a cross section, to have the same basic shape as the scattering body. By way of example, both the cutout and the scattering body have a triangular basic shape.

In accordance with at least one embodiment, the light distributor, as seen in a cross section, has a trapezoidal basic shape or a triangular basic shape. That is to say that, as seen in cross section in particular perpendicular to the radiation main side, an outer shape of the light distributor or a contour line of the light distributor can exhibit the shape of a triangular or of a trapezoid.

It is likewise possible for the light distributor to have curved side surfaces, for example, shaped like the part of a parabola, of an ellipse or of a hyperbola, as seen in cross section. It is possible for the side surfaces not to have the same shape all around. As a result, a different light guiding behavior and/or emission behavior can be realized along different spatial directions.

In accordance with at least one embodiment, the light distributor, as seen in plan view, has an average lateral extent which exceeds the average edge length of the radiation main side of the semiconductor chip by at least a factor of 10 or by at least a factor of 50 or by at least a factor of 100.

In accordance with at least one embodiment, a separating gap is situated between the light distributor and the scattering body. The separating gap is preferably evacuated or filled with a gas. An average width of the separating gap is, for example, at least 1 µm or at least 0.1 mm or at least 0.25 mm. In particular, the average width of the separating gap is at most 1.0 mm or at most 0.5 mm.

In accordance with at least one embodiment, the light distributor and the scattering body do not touch one another. It is likewise possible that the light distributor and the scattering body are not directly optically connected to one another. Directly optically connected to one another can mean that between the scattering body and the light distributor along the main emission direction there is a jump in the optical refractive index for a wavelength of the primary radiation which does not exceed 0.1 or 0.2. Preferably, the refractive index of the light distributor is not less than that of the scattering body.

In accordance with at least one embodiment, an emission main side of the scattering body and a light entrance side of the light distributor, which side faces the scattering body, are oriented parallel to one another in places or over the whole area. In other words, the separating gap then has a constant, uniform width.

In accordance with at least one embodiment, an angle between the emission main side and the light entrance side at least in places is at least 15° or at least 20° or at least 25°. Alternatively or additionally, said angle is at most 60° or at most 55°. By means of such an angle between the emission main side of the scattering body and the light entrance side of the light distributor, it is possible to achieve a polarization-selective reflection at the light entrance side, that is to say that reflection coefficients for perpendicularly and parallel polarized radiation preferably differ from one another.

In accordance with at least one embodiment, the light entrance side of the light distributor is provided with a polarization-dependently reflective coating or with a polarization-dependently reflective structuring, which is prism-shaped or pyramid-shaped, for example. What can thereby be achieved is that principally radiation having a preferred polarization direction enters into the light distributor. Radiation reflected at the light entrance side passes back to the scattering body and is scattered at the scattering body. On account of this scattering, a polarization direction can change and, upon subsequent impingement on the light entrance side, this radiation can then enter into the light distributor.

In accordance with at least one embodiment, a rear side of the surface light source is provided with the reflector and/or with a quarter-wave plate. The quarter-wave plate is designed to change a polarization direction of radiation impinging on said plate and on the reflector, in particular to rotate it by approximately 90°. For polychromatic radiation and/or a wide angle-of-incidence range, the polarization direction is rotated by 90° only approximately and within a certain width of the angular distribution.

In accordance with at least one embodiment, a polarization-selective mirror is situated at a front side of the surface light source, wherein the front side is situated opposite a rear side and the front side can constitute the emission side of the surface light source. What can be achieved by means of the polarization-selective mirror is that only radiation having a specific polarization direction leaves the surface light source. In combination with the quarter-wave plate at the rear side, it is possible to achieve so-called photon recycling and an efficient emission of a radiation having a specific preferred polarization.

In accordance with at least one embodiment, the scattering body is designed for polarization-independently scattering the primary radiation. In other words, a scattering cross section of the scattering body is then independent or substantially independent of the polarization direction of the impinging radiation. The polarization direction of the radiation is generally changed by scattering. As a result, a polarization direction of the impinging radiation can be changed by the scattering.

In accordance with at least one embodiment, an interspace between the emission main side of the scattering body and the light exit side of the surface light source is free of a light guiding body provided for lateral light guiding by means of transmission. In particular, the surface light source in that case does not have a light distributor. It is therefore possible that the radiation that has emerged from the scattering body does not pass through a solid body in a direction parallel to the radiation main side. In particular, the radiation that has emerged from the scattering body passes through further optical components perpendicularly or substantially perpendicularly to the radiation main side of the semiconductor chip and/or to a main extension direction of the surface light source.

In accordance with at least one embodiment, a flank angle of, in particular, the emission main side of the scattering body relative to the radiation main side of the semiconductor chip is at least 45° or at least 60° or at least 70° or at least 75°. Alternatively or additionally, said plank angle is at most 88° or at most 85° or at most 82°. In other words, the emission main sides of the scattering body are then oriented almost perpendicularly to the radiation main side of the semiconductor chip and/or to the main extension direction of the surface light source.

In accordance with at least one embodiment, a flank angle of the light distributor and/or of the reflector, in particular of side surfaces of the light distributor which face away from the scattering body, and of the radiation main side of the semiconductor chip is greater than 0° or at least 2° or at least 5° or at least 10° or at least 12°. Alternatively or additionally, said flank angle is at most 45° or at most 25° or at most 20° or at most 15°. In other words, the side surfaces of the light distributor can be oriented almost parallel to the radiation main side of the semiconductor chip and/or to the main extension direction of the surface light source.

In accordance with at least one embodiment, a thickness of the surface light source is at least 0.4 mm or at least 3 mm or at least 5 mm or at least 8 mm. Alternatively or additionally, the thickness is at most 50 mm or at most 35 mm or at most 25 mm or at most 15 mm.

In accordance with at least one embodiment, for a quotient L/D of an average lateral extent L of the reflector and/or of the light distributor and the thickness D of the surface light source, one or more of the following relationships hold true: 2 L/D or 5 L/D or L/D 25 or L/D 100.

A module can comprise a plurality of the surface light sources which can be arranged laterally adjacent alongside one another in a tiled fashion. The surface light sources can be oriented parallel or transversely with respect to one another. The surface light sources can be fitted on a common carrier.

In accordance with at least one embodiment, the surface light source is free of a light distributor which is designed for lateral light guidance and which is formed from a solid, such as a plastic or a glass. A lateral light distribution is then effected only or substantially only via the at least one scattering body, which can be arranged in a reflective light box. This does not rule out a situation in which there is disposed downstream of the one or the plurality of scattering bodies jointly a covering plate which serves for instance for shaping a light distribution but which is not an optical waveguide and through which radiation passes substantially only perpendicularly to main extension directions.

In accordance with at least one embodiment, the scattering body is fashioned as mechanically flexible. This can mean that the scattering body is nondestructively bendable with a bending radius of 10 cm or less or of 20 cm or less. Mounting of the scattering body is thereby facilitated.

A surface light source described here is explained in greater detail below on the basis of exemplary embodiments with reference to the drawing. In this case, identical reference signs indicate identical elements in the individual figures. In this case, however, relations to scale are not illustrated; rather individual elements may be illustrated with an exaggerated size in order to afford a better understanding.

BRIEF DESCRIPTION OF THE DRAWINGS

In the figures:
FIGS. 1 to 9C and 12A to 14 show schematic illustrations of exemplary embodiments of surface light sources described here, and
FIGS. 10A to 11B show schematic illustrations of modifications of surface light sources.

DETAILED DESCRIPTION OF ILLUSTRATIVE EMBODIMENTS

Figure 1:
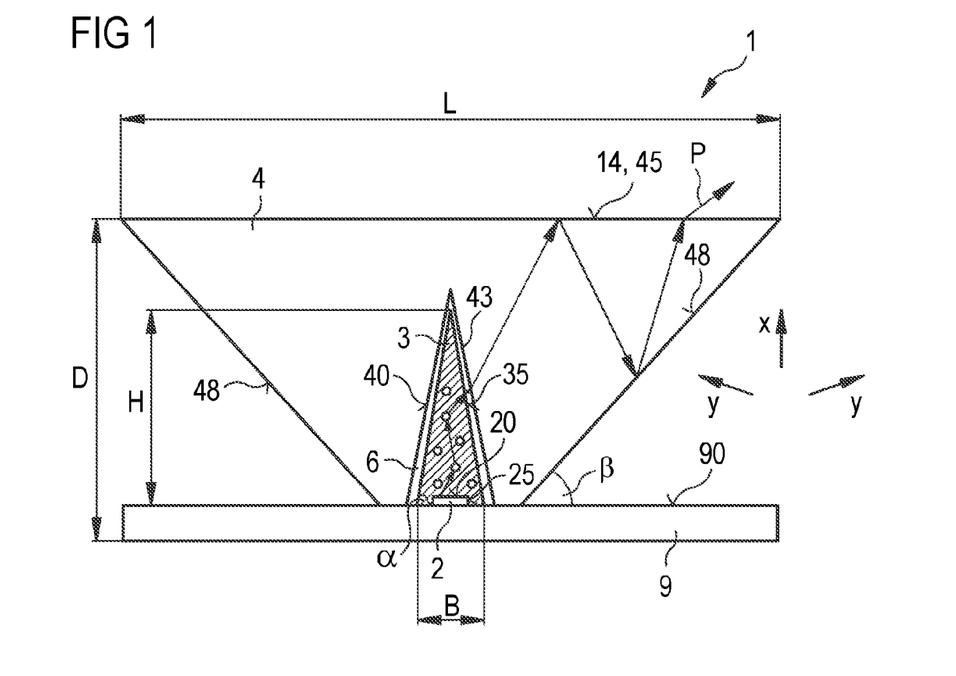

FIG. 1 schematically illustrates an exemplary embodiment of a surface light source 1 in a sectional illustration. At least one optoelectronic semiconductor chip 2, preferably a light-emitting diode, is fitted on a heat sink top side 90 of a heat sink 9. The semiconductor chip 2 has a radiation main side 20 facing away from the heat sink 9. The radiation main side 20 can be oriented, within the scope of the production tolerances, parallel to the heat sink top side 90. The semiconductor chip 2 emits a primary radiation P substantially at the radiation main side 20. The course of the primary radiation P is indicated by an arrow line in the figures. It is possible for the heat sink top side 90 to be fashioned as a reflector for the primary radiation P. A main emission direction x of the semiconductor chip 2 is oriented perpendicularly to the radiation main side 20.

A scattering body 3 is disposed downstream of the semiconductor chip 2 along the main emission direction x. The scattering body 3 comprises a matrix material and scattering particles embedded therein. As seen in cross section, the scattering body 3 is configured in the shape of a triangle, with regard to an outer contour shape. The scattering body 3 can surround the semiconductor chip 2 both at the radiation main side 20 and at side surfaces 25. The scattering body 3 can touch the semiconductor chip 2 or, in contrast to what is illustrated, can be spaced apart from the semiconductor chip 2.

By way of example, a width B of the scattering body 3 is at least 1 mm and at most 4 mm, in particular approximately 2 mm. A height H of the scattering body 3 is, for example, at least 3 mm and/or at most 10 mm, in particular approximately 6 mm. A flank angle cc between emission main sides 35 of the scattering body 3 and the heat sink top side 90 and/or the radiation main side 20 is approximately 80°.

The scattering body 3 scatters the primary radiation P. Main emission directions y of the scattering body 3 which result from the scattering are oriented substantially perpendicularly to the emission main sides 35 and therefore run approximately parallel to the radiation main side 20. The emission main sides 35 of the scattering body 3 can constitute Lambertian emitters on account of the scattering properties of the scattering body 3 for the primary radiation P, as also in all the other exemplary embodiments.

Optionally, the surface light source 1 comprises a light distributor 4. A material of the light distributor 4 is PMMA, polymethyl methacrylate, for example. The light distributor 4 has a triangular cutout 43, as seen in a cross section. The scattering body 3 is situated completely in the cutout 43. Light entrance sides 40 of the light distributor 4 at the cutout 43 can be oriented parallel to the emission main sides 35 of the scattering body 3. A separating gap 6, which is filled with air, for example, is preferably distributed between the light distributor 4 and the scattering body 3.

The light distributor 4 has a trapezoidal basic shape, as seen in cross section. Side surfaces 48 of the light distributor 4, as seen in cross section, can be configured as straight lines or, in a departure from the drawing, can run in a curved fashion. A flank angle β between the side surfaces 48 of the light distributor 4 and the heat sink top side 90 is approximately 12.5°, for example. The side surfaces 48 preferably reflect by means of total internal reflection. A thickness D of the surface light source 1 is approximately 10 mm, for example. An average lateral extent L of the light distributor 4 and/or of a reflector and also along a main extension direction of the surface light source 1 is, for example, between 2 cm and 20 cm inclusive or between 10 cm and 15 cm inclusive.

A front side 14 of the surface light source, which also constitutes an emission side of the surface light source 1, is formed by a light exit side 45 of the light distributor 4. The light exit side 45 runs substantially in a planar and level fashion. Optionally, the light exit side and/or the light entrance side and/or the emission main sides 35 and also the radiation main side 20 are provided with roughenings or structurings for improved coupling-in of radiation and/or for improved coupling-out of radiation. A conversion means, not depicted, for converting the primary radiation P into a different radiation can furthermore optionally be added to the scattering body 3. Such a conversion means can also be situated at or in the scattering body 3 or at or in the light distributor 4.

As also in all the other exemplary embodiments, in a departure from the illustration in FIG. 1, it is possible for the semiconductor chip 2 to be situated in a cutout of the heat sink 9. The scattering body 3 is then preferably fixed to the heat sink 9 and to the semiconductor chip 2 by means of a transparent adhesive, for instance a silicone. As a result, the scattering body 3 can be mounted efficiently, without the adhesive running significantly.

Figure 2:
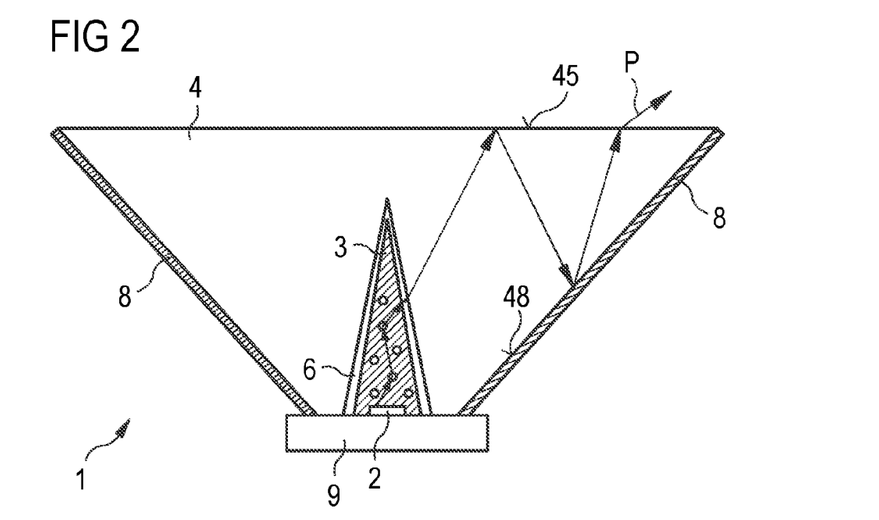

In the further exemplary embodiment as shown in a sectional illustration in FIG. 2, the side surfaces 48 of the light distributor 4 are provided with a reflector 8.

Figure 3:
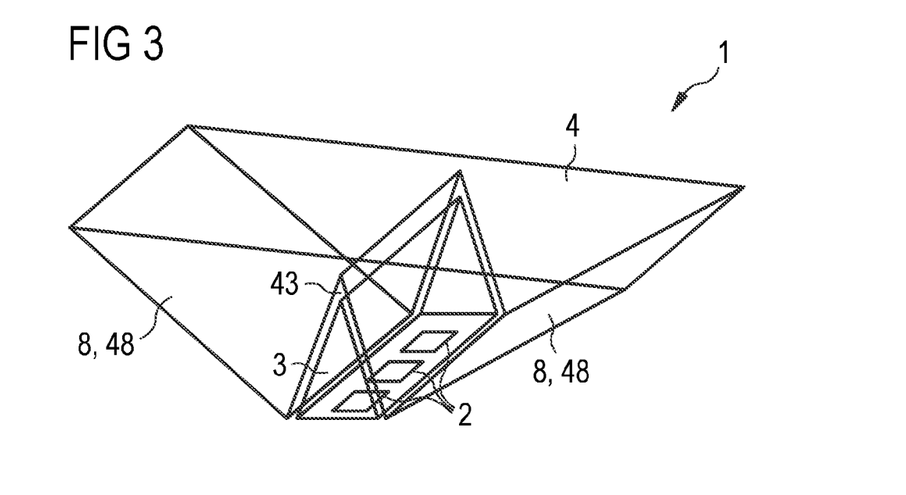

In the schematic perspective illustration in accordance with FIG. 3, the prism-shaped scattering body 3 is disposed downstream of three different semiconductor chips 2. By way of example, one of the semiconductor chips 2 emits green light, a second semiconductor chip emits red light and a third semiconductor chip emits blue light. Within the scattering body 3, a color mixing of the radiation emitted by the three semiconductor chips 2 is effected by the scattering body 3. An optical efficiency of such a surface light source 1 is, for example, between 92% and 96% inclusive.

It is optionally possible, as also in all the other exemplary embodiments, for the separating gap 6 to be filled with a medium in order to avoid or reduce a jump in the optical refractive index between the scattering body 3 and the light distributor 4. Preferably, however, the separating gap 6 is evacuated or filled with a gas. The separating gap 6 preferably enables an effective overcoupling of light radiation from the scattering body 3 into guided radiation in the light distributor 4, in particular into so-called optical waveguide modes.

Figure 4:
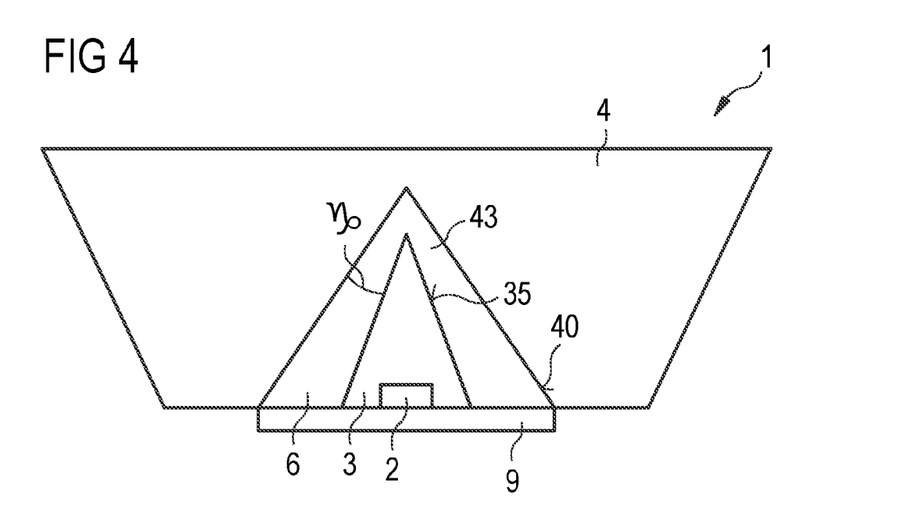

In the sectional illustration of the exemplary embodiment of the surface light source 1 in accordance with FIG. 4, the cutout 43 and also the scattering body 3 have a triangular basic shape. However, the light entrance sides 40 and the emission main sides 35 do not run parallel to one another, but rather are at an angle γ relative to one another. The angle γ is approximately 30°, for example. What can be achieved by means of such a shaping of the cutout 43 is that at the light entrance side 40 a specific proportion of the radiation emitted by the scattering body 3 is coupled into the light distributor 4 in a polarization-selective manner.

Figure 5:
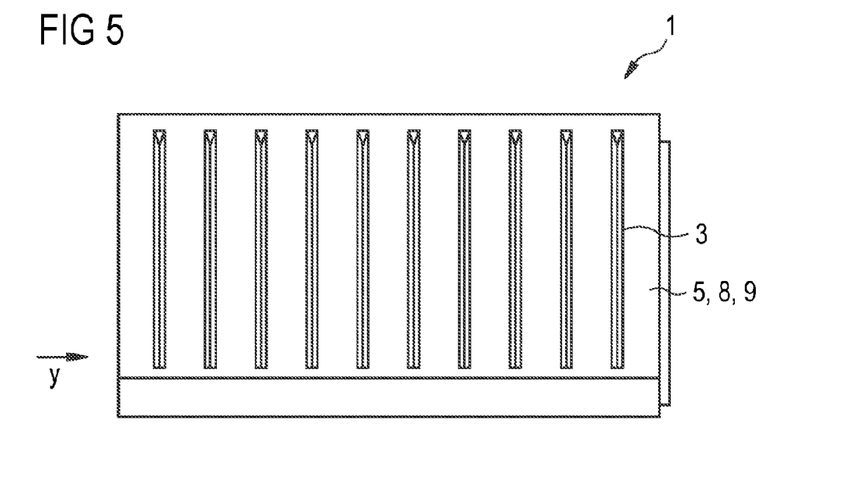

The surface light source 1 in accordance with FIG. 5 comprises a plurality of the scattering bodies 3, which are configured as elongated prisms having a triangular cross section. The individual scattering bodies 3 are arranged parallel to one another on a carrier 5, which can also be configured as a reflector 8 and/or as a heat sink 9. Each of the scattering bodies 3 is fitted above a multiplicity of semiconductor chips which are not illustrated in FIG. 5.

Figure 6A:
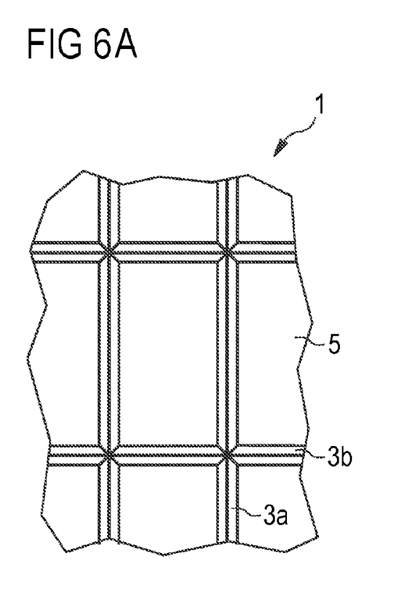

FIG. 6 illustrates plan views of further exemplary embodiments of the surface light source 1. In FIG. 6A, the scattering bodies 3a are oriented substantially perpendicularly to the scattering bodies 3b. The scattering bodies 3a, 3b partly overlap and mutually penetrate one another in the manner of a cross-ribbed vault.

Figure 6B:
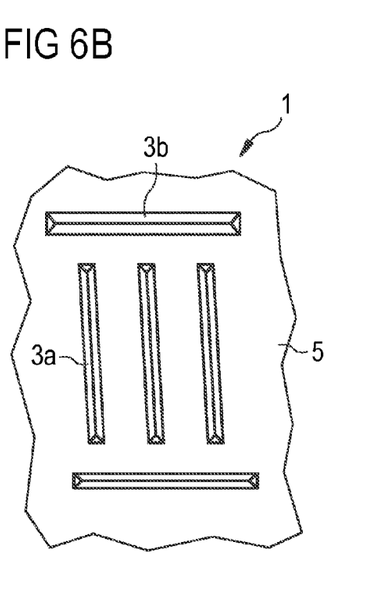

In accordance with FIG. 6B, the scattering bodies 3b at an edge are oriented perpendicularly to the scattering bodies 3a in a central region. It is optionally possible that, in particular in corner regions, the scattering bodies 3a, 3b are fitted obliquely with respect to one another, for example, at an angle of approximately 45°, this not being depicted in FIG. 6B. In contrast to what is illustrated, the scattering bodies 3a, 3b can also have mutually different lengths. In accordance with FIG. 6B, boundary surfaces of the scattering bodies 3a, 3b at short sides are oriented obliquely with respect to a top side of the carrier 5.

Figure 7:
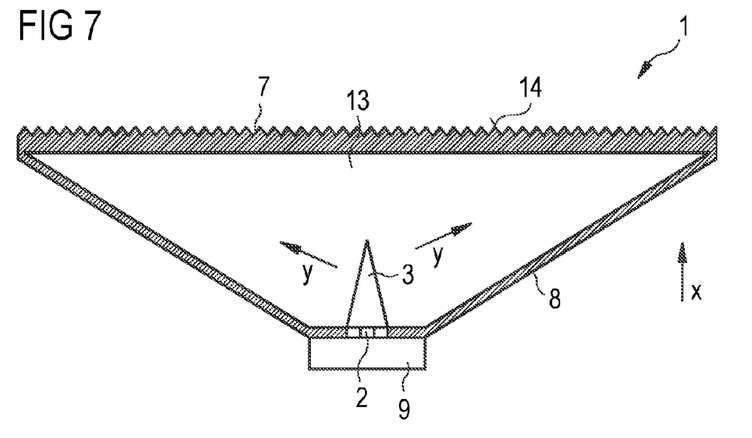

In the sectional illustration of the surface light source 1 in accordance with the exemplary embodiment as shown in FIG. 7, an interspace 13 between the scattering body 3 and a cover 7 is free of a light distributor. In other words, the interspace 13 is evacuated or, preferably, filled with a gas such as air. The cover 7 can optionally have structurings for a directional emission.

The cover 7 can therefore be a light shaping plate, as also in all the other exemplary embodiments. The radiation generated by the semiconductor chip 2 is substantially guided along the main emission direction x through the cover 7 and thus in the cover 7 preferably only as an insignificant portion along the main emission direction y, such that the cover 7 is preferably not an optical waveguide along the main emission direction y. The front side 14, constituting the emission side of the surface light source 1, is formed in particular by the cover 7.

Such a surface light source 1 constitutes a so-called light box having direct LED backlighting. The cover 7 is an optically functional plate, preferably a light shaping plate, and can serve for suppressing glare, for example. The scattering body 3 is configured, for example, in a prism-shaped, cylindrical, conical or parallelepipedal fashion. The surface light source 1 is free of an optical waveguide for lateral light guiding. The combination of the scattering body 3 and the reflector 8 ensures a homogeneous illumination in particular of the front side 14.

Since an optical waveguide, generally produced from PMMA, is dispensed with, the surface light source 1 in accordance with FIG. 7 can also be used in flame-critical applications, for example, in aircraft.

The surface light source 1 in accordance with FIG. 7 corresponds to the construction of a light box, that is to say comprises a housing having reflective inner walls and light sources incorporated therein. The light sources are formed by the semiconductor chips 2 in combination with the scattering body 3 and have a pronounced sideways emission characteristic. As a result, it is possible to reduce a structural height of the light box in comparison with systems comprising fluorescent tubes or comprising light-emitting diodes which have a Lambertian emission characteristic having a maximum perpendicular to the front side 14. In contrast to light-emitting diodes with, disposed downstream thereof, transparent optical units having a lateral emission characteristic, by virtue of the scattering body a color mixing can already be effected in the scattering body. As a result of the shaping of the side walls, that is to say in particular of the reflector 8, and as a result of the sideways emission of the scattering body 3, the light is distributed laterally widely in the light box.

In order to comply with standards with regard to glare and in order to shape a light intensity distribution curve, the cover 7 as an optically functional plate can be placed onto the light box at the front side. Such light boxes are often also used for displays or billboards to be illuminated. In this case, the cover 7 can be realized by a milk-glass sheet. When illuminating surfaces relatively far away, that is to say surfaces which are at a distance from the surface light source 1, it is also possible to use covers having more extensive optical functions, for instance having lens systems such as microlenses or having prismatic microstructures.

It is possible for the semiconductor chips 2 with the scattering body 3 to be fixedly connected to the light box, that is to say in particular to the reflector 8, or to be inserted modularly into the reflector. As a result of a modular construction, the manufacture of the reflector 8 can be separated from manufacture of the light-emitting diodes 2 and of the scattering bodies 3 and contamination of the reflector 8 or damage to the reflector 8 can be avoided or reduced.

The reflector 8 preferably has a high reflectivity and can reflect specularly or diffusely as also in all the other exemplary embodiments. The reflector can have curved mirror surfaces, as also in all the other exemplary embodiments. The shaping of the reflector 8 can support a light intensity distribution of the surface light source 1.

The heat sink 9 can be obviated if cooling of the semiconductor chips 2 by the reflector 8 is ensured. It is likewise possible for a separate heat sink to be fitted on a rear side of a printed circuit board, not shown in FIG. 7.

The cover 7 is shaped, for example, from a plastic such as PMMA or PC, polycarbonate. The cover 7 is preferably provided with refractive structures for suppressing glare and/or for shaping the light intensity distribution. In contrast to what is illustrated, the cover 7 can also be embodied in a curved fashion. Optically functional layers such as filter layers or reflection layers can be applied on at least one main side of the cover 7. By means of structurings, for instance, it is possible to obtain different emission characteristics along different spatial directions. A Fresnel-lens-like structuring of the cover 7 is also possible.

Figure 8:
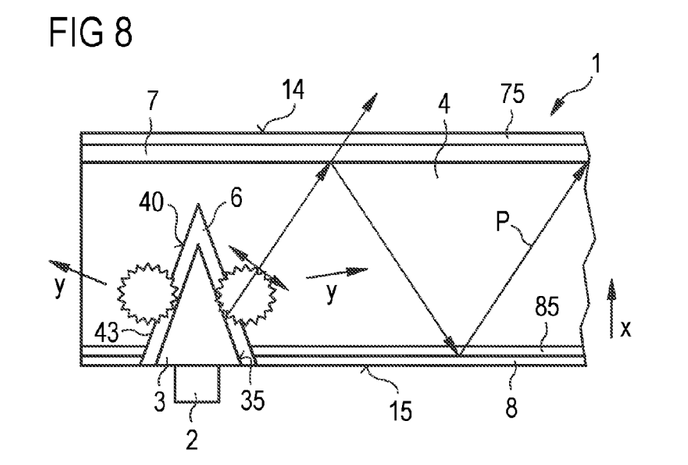

The surface light source 1 in accordance with FIG. 8 has a planar reflector 8 at a rear side 15. On the reflector 8 there is applied a coating 85 for changing the polarization of radiation impinging thereon. Preferably, a change in the polarization by means of the coating 85, over a wide range of an angle of incidence and/or of a wavelength, corresponds to that of a quarter-wave plate, at least approximately. Instead of the combination of a quarter-wave plate 85 and a directionally reflective mirror, it is also possible to use a diffusely scattering reflector 8. The cover 7 is configured as a polarization-selective mirror. A coating 75 can be applied on the cover 7, by means of which coating optical properties can be set, or by means of which coating electrodes can be realized, for instance for a liquid crystal display. Optical coupling-out structures or structured, transparent conductive oxides, for example, can be used as functional layers 75.

The course of the primary radiation P is illustrated by arrow lines; a polarization direction is symbolized by arrows and dots on the illustrated course of the primary radiation P. The scattering body 3 emits radiation in an unpolarized fashion, for example, with a Lambertian emission characteristic, symbolized by the circle-like stars at the emission main sides 35. By means of a coating and/or a structuring of the light entrance side 40 of the light distributor 4, it is optionally possible to obtain a preferred polarization of the radiation entering into the light distributor 4.

Light which impinges with a specific polarization on the polarization-selectively reflective and transmissive cover 7 is coupled out from the surface light source 1. Differently polarized light is reflected toward the quarter-wave plate 85, where it is rotated in terms of its polarization and is subsequently emitted.

As also in all the other exemplary embodiments, it is possible for a plurality of the scattering bodies 3 with the associated semiconductor chips 2 to be arranged parallel to one another in order to achieve an areal and homogeneous illumination, see, e.g., FIG. 5, in particular. A wedge shape of the scattering body 3 and/or of the cutout 43 can be optimized with regard to a preferred polarization of light in the light distributor 4, see, e.g. FIG. 4. Preferably, in that case, at the scattering body 3, light which is reflected at the light entrance side 40 is changed in terms of its polarization and is subsequently coupled into the light distributor 4. The polarizing and/or reflecting components used preferably have an as far as possible spectrally broadband characteristic.

By means of such a surface light source with such a polarization-selectively reflective cover 7 and a quarter-wave plate 85, for instance, so-called polarization light recycling is possible.

In the case of a surface light source 1 which is constructed in a manner similar to that illustrated in FIG. 8, but which has no polarization-selectively reflective cover and no quarter-wave plate, but instead a cover as shown in conjunction with FIG. 7, a polarization ratio of approximately 0.25 is achievable. The polarization ratio is the quotient of the intensity of light of one polarization and intensity of light of a polarization perpendicular thereto.

Figure 9A:
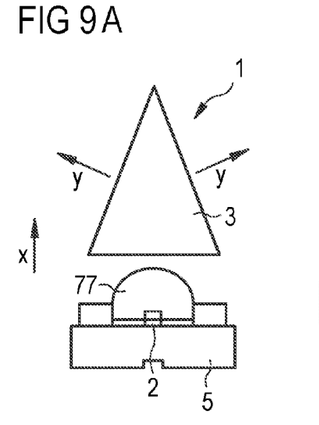

FIG. 9 shows further exemplary embodiments of the surface light source 1 in schematic sectional illustrations. In accordance with FIG. 9A, the semiconductor chip 2 is fitted on the carrier 5. As also in all the other exemplary embodiments, the semiconductor chip 2 can be provided with a conversion element. An optical element 77 in the form of a lens is disposed downstream of the semiconductor chip 2 along the main emission direction x. The separate scattering body 3 is fitted at a distance from the optical element 77. A fixing device for the scattering body 3 at the carrier 5 is not depicted in FIG. 9A.

As also in all the other exemplary embodiments, in FIG. 9A, optionally and in contrast to what is illustrated, it is possible for the scattering body 3 to have a cutout for the optical body at an underside facing the semiconductor chip 2. A conversion means can also be added to the scattering body 3 or fitted on the scattering body 3, as optionally also in all the other exemplary embodiments.

Figure 9B:
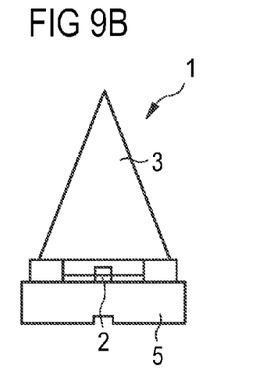

In the exemplary embodiment as shown in FIG. 9B, the surface light source 1 has an under-potting laterally alongside the semiconductor chip 2 and a planar potting along the main emission direction x above the semiconductor chip 2. The separate scattering body 3 is fitted on said planar potting, which projects beyond the semiconductor chip 2 in a direction away from the carrier 5. As also in all the other exemplary embodiments, the semiconductor chip 2 can be fitted in a cavity of the carrier 5. Electrical lines of the carrier 5 are merely indicated in each case in the figures.

Figure 9C:
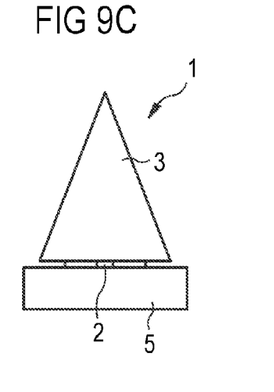

In accordance with FIG. 9C, the scattering body 3 is a primary optical unit of the semiconductor chip 2 which is disposed optically directly downstream of the semiconductor chip 2. In accordance with FIG. 9C, therefore, no other optically active components are situated between the semiconductor chip 2 and the scattering body 3. Optionally, the semiconductor chip 2 is surrounded all around by the reflective under-potting, see, e.g., FIG. 9B.

Figure 10A:
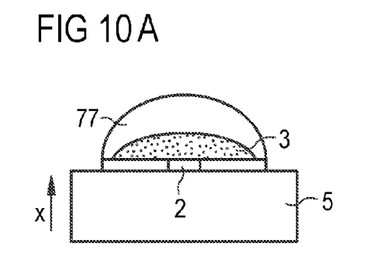

FIG. 10 illustrates modifications of the surface light source. In accordance with FIG. 10A, the scattering body 3 is embodied in a lens-type fashion and is followed by the optical body 77, which is likewise embodied in a lens-type fashion and serves for beam shaping.

Figure 10B:
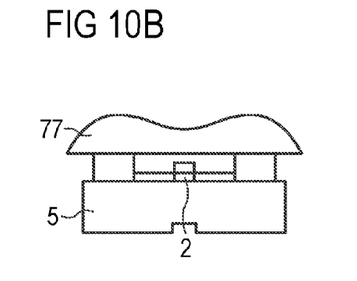

In the case of the modification shown in FIG. 10B, the optical body 77 is disposed directly downstream of the semiconductor chip 2. The component is free of a scattering body. The optical body 77 has a central minimum and a wall running all around. Such an optical body 77 has a substantially lateral emission, and only a comparatively small proportion of radiation is emitted parallel to the emission direction x of the semiconductor chip 2. In the case of such optical bodies 77 as shown in FIG. 10B, however, alignment relative to the semiconductor chip 2 is important and comparatively complex. Moreover, a mixing of different wavelengths of radiation within the optical body 77 cannot be achieved, since the optical body 77 has no or substantially no light-scattering properties.

Figure 11A:
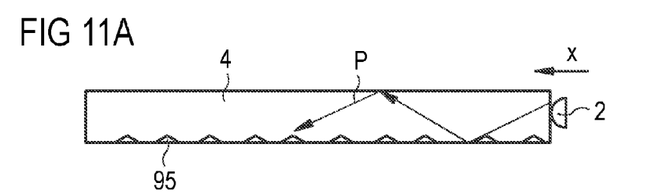

A backlighting device is shown in the modification in accordance with FIG. 11A, in which backlighting device a light source is fitted locally to an edge of an optical waveguide. Coupling-in losses can result from this. Moreover, absorption of radiation in the optical waveguide can occur and, on account of the local fitting of the light source 2, precautions for heat dissipation are necessary, not shown in FIG. 11A. For coupling out light, use is made, in particular, of a structuring 95 at an underside.

Figure 11B:
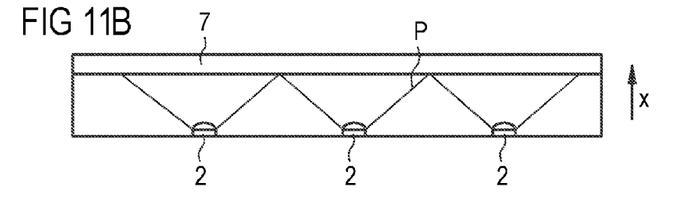

In the modification in accordance with FIG. 11B, the light sources 2 are fitted to a base of a light box. In order to illuminate the cover 7 uniformly, the light box must have a comparatively large height corresponding approximately to the distance between adjacent semiconductor chips. Consequently, the component in accordance with FIG. 11B has a comparatively large structural height in the range of several centimeters.

Figure 12A:
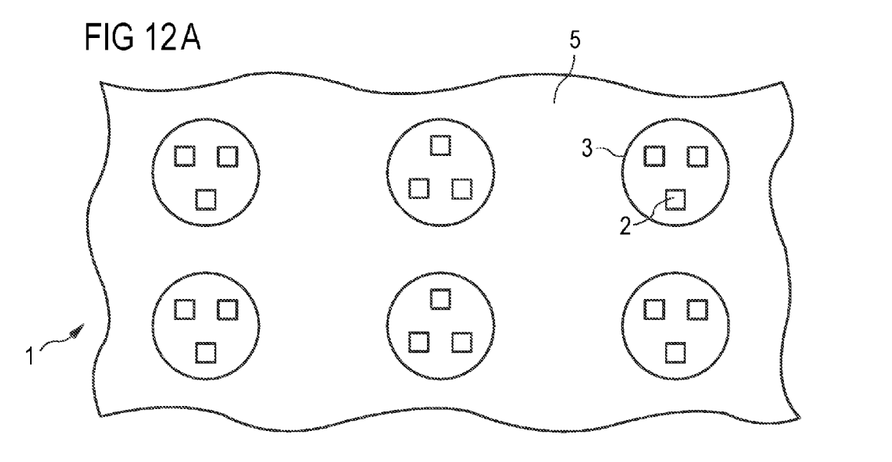
Figure 12B:
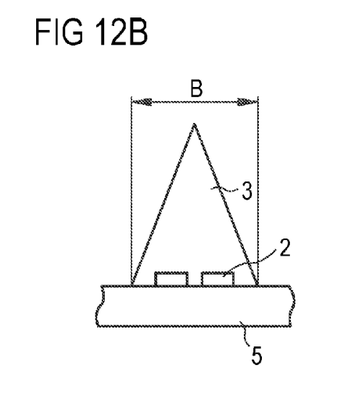
Figure 12C:
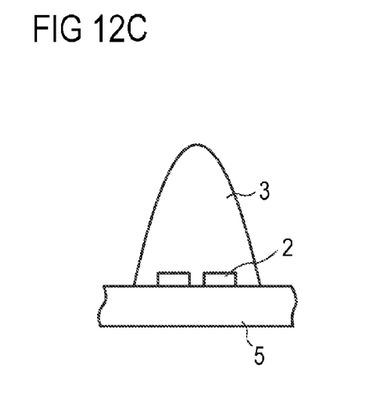

FIG. 12 shows a further exemplary embodiment of the surface light source 1, see the plan view in FIG. 12A and the schematic sectional illustrations in FIGS. 12B and 12C. A plurality of scattering bodies 3 are arranged in a matrix-like fashion. The scattering bodies 3 spaced apart from one another completely cover in each case three semiconductor chips 2 arranged in a closely adjacent fashion. Each of the semiconductor chips 2 emits light in a different spectral range. In particular, one of the semiconductor chips 2 respectively emits red, green and blue light.

In accordance with FIG. 12B, the scattering bodies 3 are embodied in a conical fashion. In accordance with FIG. 12C, the rotationally symmetrical scattering bodies 3, as seen in cross section, have curved boundary areas and a rounded tip. As also in all the other exemplary embodiments, it is possible for the width B of the scattering bodies 3 to be at least double, triple or quadruple and/or at most twenty times, ten times or five times an average edge length of the semiconductor chips 2.

In contrast to what is illustrated, a light distributor can be disposed downstream of the scattering bodies 3, for instance analogously to FIG. 1. Preferably, an air gap is situated between the light distributor and the scattering bodies 3 and the cutouts in the light distributor then have in particular the same basic shape as the scattering bodies 3.

Figure 13:
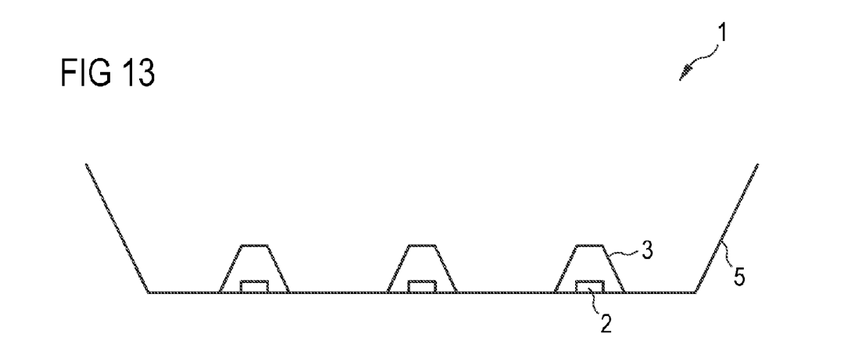

In the case of the exemplary embodiment in accordance with FIG. 13, the scattering bodies 3 are configured in a trapezoidal fashion as seen in cross section. The scattering bodies 3 can be shaped rotationally symmetrically, see FIG. 12, or have an elongated form, see FIGS. 3 and 6. The scattering bodies 3 are accommodated in a reflective light box that forms the carrier 5.

In a departure from the illustration, the surface light source 1 can also comprise just exactly one scattering body 3, in the same way as is possible in connection with FIG. 12. The average lateral extent is then less than 12 cm, for example.

Figure 14:
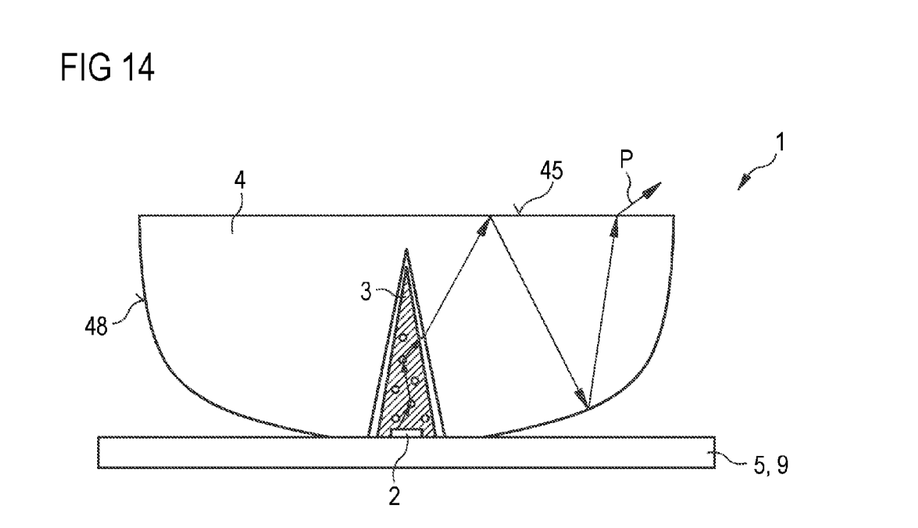

The light distributor 4 of the exemplary embodiment in accordance with FIG. 14 has curved side surfaces 48, as seen in cross section. Such a light distributor 4 can also be used in all the other exemplary embodiments.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A surface light source comprising:
   an optoelectronic semiconductor chip designed to generate a primary radiation and having a radiation main side;
   a scattering body disposed downstream of the radiation main side along a main emission direction of the semiconductor chip, the scattering body designed to scatter the primary radiation; and
   a radiation-transmissive light distributor shaped as a solid body,
   wherein the scattering body has a main emission direction that is oriented obliquely with respect to the main emission direction of the semiconductor chip,
   wherein the scattering body is located in a cutout of the light distributor, the cutout and the scattering body having a triangular shape as seen in a cross section,
   wherein the light distributor, as seen in a cross section, has a trapezoidal outer shape and an average lateral extent of the light distributor exceeds an average edge length of the radiation main side of the semiconductor chip by at least a factor of 20, and
   wherein an angle between an emission main side of the scattering body and a light entrance side of the light distributor is, at least in places, between 15 degrees and 60 degrees inclusive, the light entrance side facing the emission main side.

2. The surface light source according to claim 1, wherein semiconductor chips over which the scattering body extends are arranged along a straight line, and the main emission direction of the scattering body is oriented perpendicularly to the line with a tolerance of at most 15° and as seen in plan view.

3. The surface light source according to claim 1, wherein a plurality of the scattering bodies are arranged in a manner spaced apart from one another on a carrier, and wherein the scattering bodies are arranged at least partly parallel to one another and/or at least partly transversely with respect to one another or in a cruciform fashion.

4. The surface light source according to claim 1, wherein the scattering body is applied directly on the radiation main side, and wherein side surfaces of the semiconductor chip are free of the scattering body.

5. The surface light source according to claim 1, further comprising a reflector that as seen in a cross section, has a trapezoidal basic shape, wherein an average lateral extent of the reflector exceeds an average edge length of the radiation main side of the semiconductor chip by at least a factor of 100.

6. The surface light source according to claim 5, wherein a rear side is provided with the reflector and with a quarter-wave plate and a polarization-selective mirror is fitted to a front side, the front side being situated opposite the rear side and constitutes a light exit side of the surface light source, and wherein the scattering body is designed for polarization-independent scattering of the primary radiation.

7. The surface light source according to claim 1, further comprising a heat sink having a heat sink top side wherein the semiconductor chip is fitted to the heat sink top side, and the heat sink top side is designed to reflect the primary radiation, and wherein an average lateral extent of the heat sink top side exceeds an average edge length of the radiation main side of the semiconductor chip by at least a factor of 100.

8. The surface light source according to claim 1, further comprising an evacuated or gas-filled separating gap located between the light distributor and the scattering body, wherein the light distributor does not touch the scattering body, and wherein an average width of the separating gap is at least 0.1 mm.

9. The surface light source according to claim 1, wherein the light entrance side is provided with a polarization-dependently reflective coating or structuring.

10. The surface light source according to claim 1, wherein an interspace between a emission main side of the scattering body and a light exit side of the surface light source is free of a light guiding body provided for lateral light guiding by transmission.

11. The surface light source according to claim 1, wherein the surface light source comprises a reflector that, as seen in cross-section, has a trapezoidal shape, wherein a flank angle of the scattering body is between 70° and 85° inclusive, wherein a flank angle of the light distributor is between 5° and 20° inclusive, wherein the flank angles are relative to a radiation main side of the semiconductor chip, and wherein a thickness D of the surface light source is between 5 mm and 50 mm inclusive and, for a quotient L/D of an average lateral extent L of the reflector and/or of the light distributor and the thickness D, the following holds true: $5 \leq L/D \leq 25$.

12. The surface light source according to claim 1, wherein a plurality of scattering bodies are shaped symmetrically, wherein each of the scattering bodies covers at least two semiconductor chips that emit in different colors, wherein an average distance between the semiconductor chips is at most 25% of a height of the scattering bodies, and wherein the scattering bodies are arranged in a manner spaced apart from one another.

13. A surface light source comprising:
   an optoelectronic semiconductor chip designed to generate a primary radiation and having a radiation main side;

a scattering body disposed downstream of the radiation main side along a main emission direction of the semiconductor chip, the scattering body designed to scatter the primary radiation; and a reflector that, as seen in a cross section, has a trapezoidal shape, wherein an average lateral extent of the reflector exceeds an average edge length of the radiation main side of the semiconductor chip by at least a factor of 100, wherein the scattering body has a main emission direction that is oriented obliquely with respect to the main emission direction of the semiconductor chip, wherein a rear side is provided with the reflector and with a quarter-wave plate, wherein a polarization-selective mirror is fitted to a front side, the front side being situated opposite the rear side and constitutes a light exit side of the surface light source, and wherein the scattering body is designed for polarization-independent scattering of the primary radiation.

* * * * *